(12) United States Patent
Takahashi (10) Patent No.: US 8,558,119 B2
(45) Date of Patent: Oct. 15, 2013

(54) CIRCUIT MODULE

(75) Inventor: Yasuhiro Takahashi, Mishima-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 179 days.

(21) Appl. No.: 12/876,438

(22) Filed: Sep. 7, 2010

(65) Prior Publication Data

US 2011/0061920 A1    Mar. 17, 2011

(30) Foreign Application Priority Data

Sep. 16, 2009 (JP) .................................. 2009-214180

(51) Int. Cl.
*H05K 1/16*    (2006.01)

(52) U.S. Cl.
USPC ............ 174/260; 174/250; 174/261; 361/397

(58) Field of Classification Search
USPC ........................... 174/260, 250, 261; 361/397
See application file for complete search history.

(56) References Cited

U.S. PATENT DOCUMENTS

| | | | |
|---|---|---|---|
| 6,998,539 B2 * | 2/2006 | Andrews et al. | 174/259 |
| 2008/0218289 A1 * | 9/2008 | Wada | 333/24.2 |

FOREIGN PATENT DOCUMENTS

| | | |
|---|---|---|
| JP | 09-260429 A | 10/1997 |
| JP | 11-111768 A | 4/1999 |
| JP | 11-204564 A | 7/1999 |
| JP | 2000-332055 A | 11/2000 |
| JP | 2002-270645 A | 9/2002 |
| JP | 2009-49879 A | 3/2009 |

OTHER PUBLICATIONS

Official Communication issued in corresponding Japanese Patent Application No. 2009-214180, mailed on Feb. 21, 2012.

* cited by examiner

*Primary Examiner* — Timothy Thompson
*Assistant Examiner* — Andargie M Aychillhum
(74) *Attorney, Agent, or Firm* — Keating & Bennett, LLP (57) ABSTRACT

An electronic component includes a component body including a mounting surface facing a circuit substrate, and a plurality of first external electrodes arranged on the mounting surface so as to extend between a first side and a second side of the mounting surface substantially parallel with each other and so as to be within a first region having a width that is substantially equal to half a length of the first side in a direction in which the first side extends. A circuit substrate includes a substrate body, a plurality of second external electrodes, arranged on a main surface of the substrate body, respectively connected to the plurality of first external electrodes, and support units arranged to protrude from the main surface of the substrate body and such that the electronic component overlaps the support units outside the first region.

10 Claims, 7 Drawing Sheets

CIRCUIT MODULE

BACKGROUND OF THE INVENTION

1. Field of the Invention

The present invention relates to circuit modules, and more specifically to a circuit module including an electronic component mounted thereon.

2. Description of the Related Art

Figure 6:
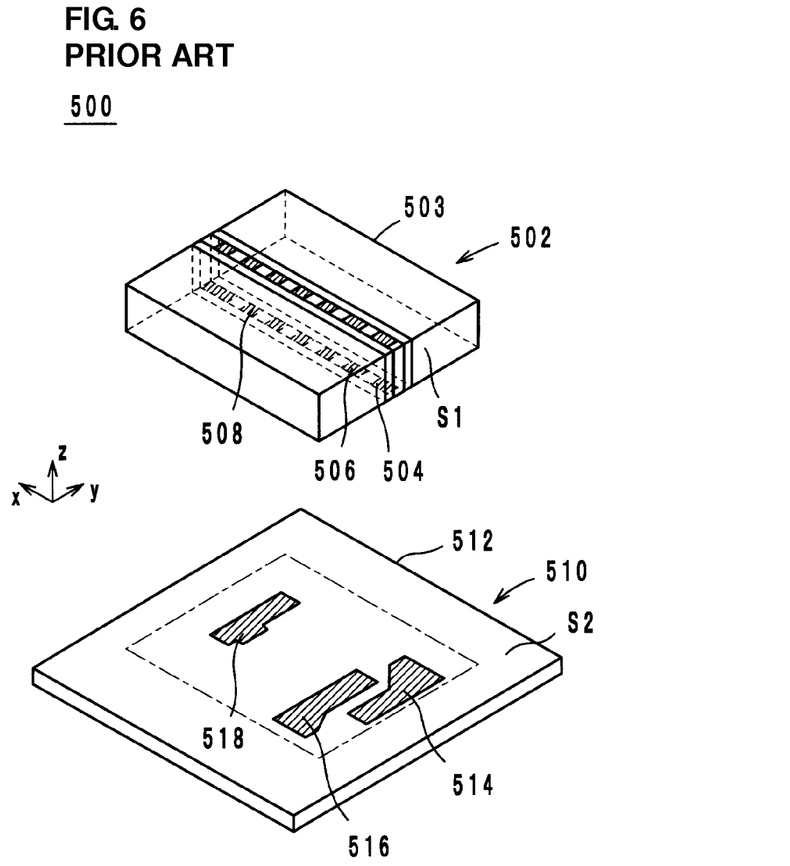
FIG. 6 is an exploded perspective view of the nonreciprocal circuit device described in Japanese Unexamined Patent Application Publication No. 2009-49879.

Known circuit modules include a 2-port nonreciprocal circuit device (hereinafter simply called a nonreciprocal circuit device) described in, for example, Japanese Unexamined Patent Application Publication No. 2009-49879. Hereinafter, the nonreciprocal circuit device described in Japanese Unexamined Patent Application Publication No. 2009-49879 is described with reference to the attached drawings. FIG. 6 is an exploded perspective view of a nonreciprocal circuit device 500. In FIG. 6, the direction of the line normal to the main surface of a circuit substrate 510 is defined as a z-axis direction. When an electronic component 502 is viewed in plan view from the z-axis direction, a direction that extends along the long side of the electronic component 502 is defined as an x-axis direction, and a direction that extends along the short side of the electronic component 502 is defined as a y-axis direction.

The nonreciprocal circuit device 500 includes the electronic component 502 and the circuit substrate 510. The nonreciprocal circuit device 500 includes a substantially plate-shaped yoke in addition to the electronic component 502 and the circuit substrate 510, but the substantially plate-shaped yoke and the like are omitted in FIG. 6.

The electronic component 502 includes a component body 503 and external electrodes 504, 506, and 508. The component body 503 has a substantially rectangular parallelepiped shape, and contains two coils. The external electrodes 504, 506, and 508 are arranged in a row along the x-axis direction on a lower (in the negative direction of the z-axis) main surface (hereinafter called a mounting surface S1) of the component body 503 at the center of the mounting surface S1 in the y-axis direction.

The circuit substrate 510 includes a substrate body 512 and external electrodes 514, 516 and 518. The substrate body 512, which is a substantially plate-shaped substrate, contains a capacitor, a resistor, and the like. The external electrodes 514, 516 and 518 are arranged in a row along the x-axis direction on an upper (in the positive direction of the z-axis) main surface (hereinafter called a main surface S2) of the component body 503. The external electrodes 504, 506, and 508 are respectively connected to the external electrodes 514, 516 and 518. As a result, the electronic component 502 is mounted on the circuit substrate 510, and the nonreciprocal circuit device 500 is formed. The nonreciprocal circuit device 500 described above has a characteristic in that a signal is allowed to be transmitted only in a predetermined direction, and not in the opposite direction.

Figure 7:
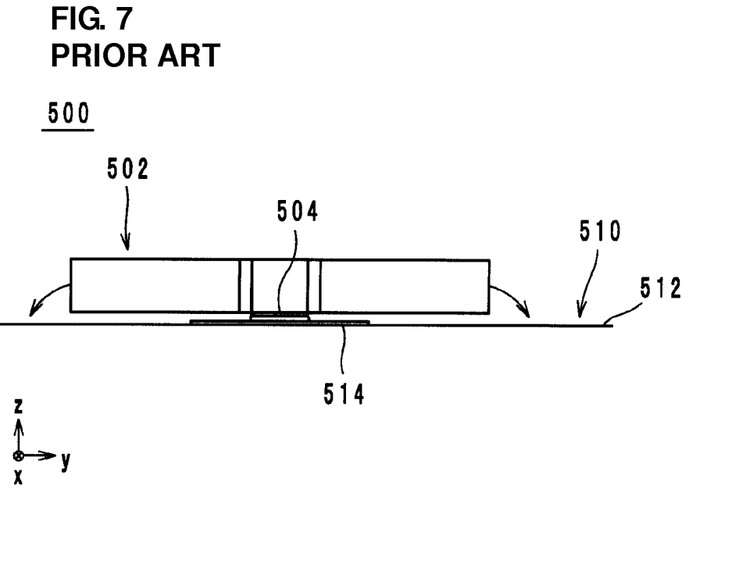
FIG. 7 is an illustration of the nonreciprocal circuit device in FIG. 6 viewed in plan view from the positive direction of the x-axis.

However, in the nonreciprocal circuit device 500 described in Japanese Unexamined Patent Application Publication No. 2009-49879, it is difficult to mount the electronic component 502 on the circuit substrate 510 reliably, as described below. FIG. 7 is an illustration of the nonreciprocal circuit device 500 viewed in plan view from the positive direction of the x-axis.

As described above, the external electrodes 504, 506, and 508 are arranged in a row along the x-axis direction on the mounting surface S1 of the component body 503, which is located on the negative direction side in the z-axis direction, at the center of the mounting surface S1 in the y-axis direction. Hence, in the nonreciprocal circuit device 500, the electronic component 502 is fixed to the circuit substrate 510 only at the center thereof in the y-axis direction, as illustrated in FIG. 7. In other words, the electronic component 502 is not fixed to the circuit substrate 510 at the both ends thereof in the y-axis direction. Hence, due to an external shock, for example, the electronic component 502 may possibly fall over onto the circuit substrate 510 in the directions denoted by the arrows in FIG. 7. As a result, wiring lines between the electronic component 502 and the circuit substrate 510 may possibly be broken.

SUMMARY OF THE INVENTION

Accordingly, preferred embodiments of the present invention provide a circuit module that can prevent an electronic component from falling over onto a circuit substrate.

According to a preferred embodiment of the present invention, a circuit module includes a circuit substrate and an electronic component mounted on the circuit substrate, and the electronic component includes a component body including a substantially rectangular mounting surface facing the circuit substrate; and a plurality of first external electrodes arranged on the mounting surface so as to extend between a first side and a second side of the mounting surface parallel or substantially parallel with each other and so as to be within a first region having a width that is substantially equal to half a length of the first side in a direction in which the first side extends, and the circuit substrate includes a substantially plate-shaped substrate body; a plurality of second external electrodes arranged on a main surface of the substrate body respectively connected to the plurality of the first external electrodes; and a support unit arranged so as to protrude from the main surface of the substrate body and such that the electronic component overlaps the support unit outside the first region when viewed in plan view from a direction of a line normal to the main surface.

According to another preferred embodiment of the present invention, a circuit module includes a circuit substrate and an electronic component mounted on the circuit substrate, and the electronic component includes a component body including a mounting surface facing the circuit substrate; and a plurality of first external electrodes arranged on the mounting surface and overlapping a substantially straight line defined on the mounting surface, and the circuit substrate includes a substantially plate-shaped substrate body; a plurality of second external electrodes arranged on a main surface of the substrate body respectively connected to the plurality of the first external electrodes; and a support unit arranged so as to protrude from the main surface of the substrate body and such that the electronic component overlaps the support unit at a location which the substantially straight line does not overlap when viewed in plan view from a direction of a line normal to the main surface.

According to the various preferred embodiments of the present invention, an electronic component is prevented from falling over onto a circuit substrate.

The above and other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, the configurations of circuit modules according to preferred embodiments of the present invention are described with reference to the attached drawings.

Figure 1:
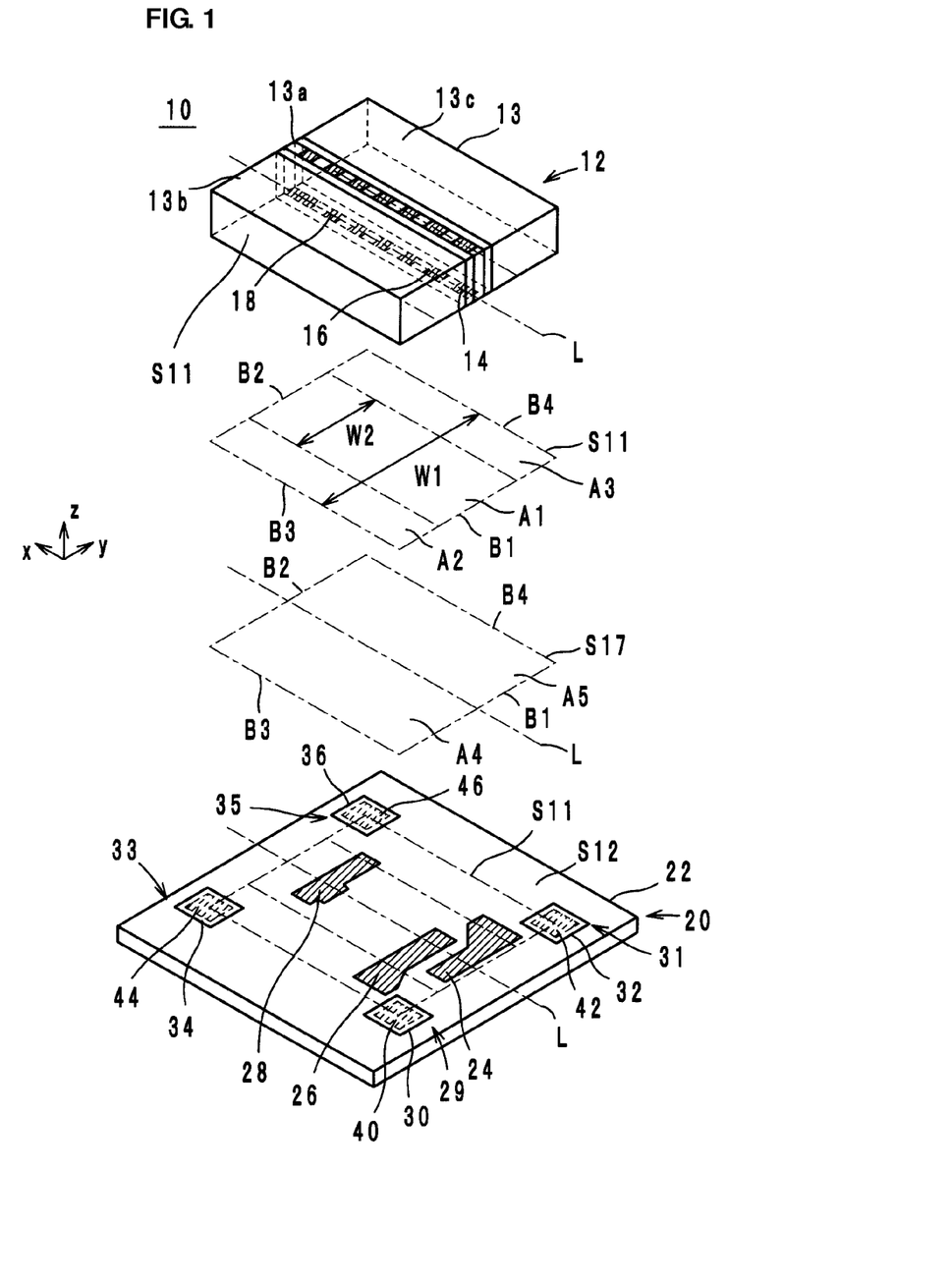
FIG. 1 is an exploded perspective view of a circuit module according to a preferred embodiment of the present invention.

Hereinafter, the configuration of a circuit module according to a preferred embodiment or the present invention is described. FIG. 1 is an exploded perspective view of a circuit module 10. Referring to FIG. 1, the direction of the line normal to the main surface of a circuit substrate 20 is defined as a z-axis direction. When an electronic component 12 is viewed in plan view from the z-axis direction, a direction that extends along the long side of the electronic component 12 is defined as an x-axis direction, and a direction that extends along the short side of the electronic component 12 is defined as a y-axis direction.

The circuit module 10 is a nonreciprocal circuit device having a characteristic in that a signal is allowed to be transmitted only in a predetermined direction, and not in the opposite direction. The circuit module 10 includes the electronic component 12 and the circuit substrate 20, and has a configuration in which the electronic component 12 is mounted on the circuit substrate 20. The circuit module 10 includes a substantially plate-shaped yoke in addition to the electronic component 12 and the circuit substrate 20, but the substantially plate-shaped yoke is omitted in FIG. 1.

Referring to FIG. 1, the electronic component 12 includes a component body 13 and external electrodes 14, 16, and 18, and preferably has substantially the same configuration as the electronic component described in Japanese Unexamined Patent Application Publication No. 2009-49879 (called a ferrite-magnet assembly in this document). The component body 13, shaped substantially like a rectangular parallelepiped, has a mounting surface S11 on the negative direction side in the z-axis direction. The mounting surface S11 is a main surface that faces the circuit substrate 20 when the electronic component 12 is mounted on the circuit substrate 20. Note that the mounting surface S11 of the component body 13 need only be substantially rectangular and may be appropriately changed to obtain desired electrical characteristics or a desired mounting state.

Note that, in FIG. 1, the mounting surface S11 is illustrated alone using one-dot chain lines. Referring to FIG. 1, the mounting surface S11 has sides B1 to B4. The sides B1 and B2, which are short sides substantially parallel with each other, extend in the y-axis direction. The sides B3 and B4, which are long sides substantially parallel with each other, extend in the x-axis direction. The mounting surface S11 has a region A1 extending in the x-axis direction between the sides B1 and B2 and having a width substantially half the width of the side B1 in the y-axis direction. The center of the region A1 in the y-axis direction coincides with the center of the mounting surface S11 in the y-axis direction. The mounting surface S11, when viewed in plan view from the z-axis direction, is divided by the region A1 into two regions A2 and A3. The region A2 is a substantially rectangular region that contacts the region A1 on the mounting surface S11 from the negative direction of the y-axis. The region A3 is a substantially rectangular region that contacts the region A1 on the mounting surface S11 from the positive direction of the y-axis.

Referring to FIG. 1, one substantially straight line L is defined on the mounting surface S11. The substantially straight line L extends in the x-axis direction, passing through the midpoints of the sides B1 and B2. When viewed from the z-axis direction, the mounting surface S11 is divided into regions A4 and A5 in plan view. The region A4 is a substantially rectangular region located on the negative direction side of the substantially straight line L in the y-axis direction. The region A5 is a substantially rectangular region located on the positive direction side of the substantially straight line L in the y-axis direction.

The component body 13 preferably includes a coil unit 13a and magnets 13b and 13c. Referring to FIG. 1, the coil unit 13a, which is shaped substantially like a rectangular parallelepiped with its longitudinal direction in the x-direction, includes two coils. The magnets 13b and 13c each have a substantially rectangular parallelepiped shape with its longitudinal direction in the x-axis. The magnet 13b is arranged on the negative direction side of the coil 13a in the y-axis, and is pasted to the coil 13a using adhesive. The magnet 13c is arranged on the positive direction side of the coil 13a in the y-axis direction, and is fixed to the coil 13a preferably using adhesive, for example. Thereby, when viewed from the z-axis direction, the magnet 13b overlaps the regions A2 and A4 in plan view, and the magnet 13c overlaps the regions A3 and A5 in plan view.

The external electrodes 14, 16, and 18 are conductor films arranged in a row along the x-axis direction on the mounting surface S11 of the component body 13 at the center of the mounting surface S11 in the y-axis direction. In more detail, the external electrodes 14, 16, and 18 overlap the substantially straight line L, as illustrated in FIG. 1. Furthermore, the external electrodes 14, 16, and 18 are arranged within the region A1 of the mounting surface S11. Note that, in FIG. 1, hatched regions other than the external electrodes 14, 16, and 18 illustrate portions of the coil.

The circuit substrate 20 includes a substrate body 22, external electrodes 24, 26, and 28, and support units 29, 31, 33, and 35. The substrate body 22 is a substrate shaped substantially like a plate, and includes capacitors, resistors, and the like. The external electrodes 24, 26, and 28 are arranged in a row along the x-axis on an upper (in the positive direction of the z-axis) main surface S12 of the substrate body 22, and are made of a metal, such as Ag or Cu. The external electrodes 14, 16, and 18 are respectively soldered to the external electrodes 24, 26, and 28.

Figure 2:
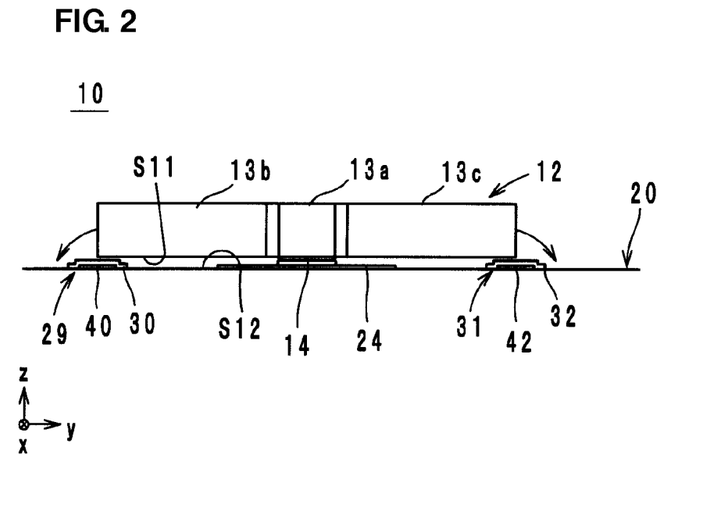
FIG. 2 is an illustration of a circuit module viewed in plan view from the positive x-axis direction.

Now, the support units 29, 31, 33, and 35 will be described. FIG. 2 is an illustration of the circuit module 10 when viewed in plan view from the positive direction of the x-axis. Referring to FIGS. 1 and 2, the support units 29, 31, 33, and 35 are arranged on the main surface S12 of the substrate body so as to protrude in the positive direction of the z-axis (that is, toward the electronic component 12). However, the support units 29, 31, 33, and 35 are not in contact with the mounting surface S11. The support units 29, 31, 33, and 35 are arranged at locations where the substantially straight line L does not overlap the support units 29, 31, 33, and 35 such that the electronic component 12 overlaps the support units 29, 31, 33, and 35 when viewed in plan view from the z-axis direction. In more detail, the region A4 of the mounting surface S11 overlaps the support units 29 and 33 when viewed in plan view from the z-axis direction, and the region A5 of the mounting surface S11 overlaps the support units 31 and 35 when viewed in plan view from the z-axis direction. Thereby, the magnet 13b overlaps the support units 29 and 33 when viewed in plan view from the z-axis direction, and the magnet 13c overlaps the support units 31 and 35 when viewed in plan view from the z-axis direction.

When viewed from the z-axis direction, the support units 29, 31, 33, and 35 are arranged such that the electronic component 12 overlaps the support units 29, 31, 33, and 35 outside the region A1 in plan view. In more detail, the region A2 of the mounting surface S11 overlaps the support units 29 and 33 when viewed in plan view from the z-axis direction, and the region A3 of the mounting surface S11 overlaps the support units 31 and 35 when viewed in plan view from the z-axis direction. Thereby, the magnet 13b overlaps the support units 29 and 33 when viewed in plan view from the z-axis direction, and the magnet 13c overlaps the support units 31 and 35 when viewed in plan view from the z-axis direction.

Further, the edges of the mounting surface S11 overlap the support units 29, 31, 33, and 35 when viewed in plan view from the z-axis direction. In the present preferred embodiment, the four corners of the mounting surface S11 respectively overlap the support units 29, 31, 33, and 35 when viewed in plan view from the z-axis direction.

Here, the structures of the support units 29, 31, 33, and 35 are described. Referring to FIGS. 1 and 2, the support unit 29 includes a resist film 30 and a dummy electrode 40. In more detail, the dummy electrode 40 is arranged on the mounting surface S11 and is made of a metal such as Ag or Cu, similarly to the external electrodes 24, 26, and 28. The dummy electrode 40, which is not connected to circuit devices or wiring in the surrounding region, is isolated from the surrounding region. The resist film 30 preferably is, for example, an epoxy resin insulator film, and is arranged to cover the dummy electrode 40.

The support unit 31 includes a resist film 32 and a dummy electrode 42. The support unit 33 includes a resist film and a dummy electrode 44. The support unit 35 includes a resist film 36 and a dummy electrode 46. The support units 31, 33, and 35 have the same configuration as the support unit 29, and hence, further description is omitted.

According to the circuit module 10 having the configuration described above, the electronic component 12 is prevented from falling over onto the circuit substrate 20, as will be described below. Referring to FIG. 1, in the circuit module 10, the substantially straight line L overlaps the external electrodes 14, 16, and 18. Furthermore, the external electrodes 14, 16, and 18 are arranged within the region A1 of the mounting surface S11. Hence, referring to FIG. 2, in the circuit module 10, the electronic component 12 is fixed to the circuit substrate 20 only at the vicinity of the center thereof in the y-axis direction. In other words, the electronic component 12 is not fixed to the circuit substrate 20 at the both ends thereof in the y-axis direction. Hence, unless measures are taken, the electronic component 12 may possibly fall over onto the circuit substrate 20 in the directions denoted by the arrows in FIG. 2 due to an external shock, for example. Since the mounting surface S11 is substantially rectangular, the electronic component 12 is likely to fall over when receiving a shock from the sides thereof located at the long sides of the mounting surface S11. As a result, wiring lines between the electronic component 12 and the circuit substrate 20 may possibly be broken.

Accordingly, in the circuit module 10, the support units 29, 31, 33, and 35 are arranged on the main surface S12 of the substrate body 22 so as to protrude in the positive direction of the z-axis. The top surfaces of the support units 29, 31, 33, and 35 are located on the positive direction side of the main surface S12 in the z-axis direction. Hence, the mounting surface S11 of the electronic component 12 contacts the support units 29, 31, 33, and 35 before contacting the electronic component 12. This prevents the electronic component 12 from significantly tilting on the circuit substrate 20. As a result, the breaking of wiring lines between the electronic component 12 and the circuit substrate 20 is prevented.

In addition, in the circuit module 10, since the support units 29, 31, 33, and 35 are not in contact with the mounting surface S11, the precision with which the heights of the support units 29, 31, 33, and 35 are set in the z-axis direction is allowed to be relatively low. In more detail, in the case in which the support units 29, 31, 33, and 35 are in contact with the mounting surface S11, a variation in the heights of the support units 29, 31, 33, and 35 in the z-axis direction causes a variation in the size of a gap between the electronic component 12 and the circuit substrate 20. Hence, in the case in which the support units 29, 31, 33, and 35 are in contact with the mounting surface S11, it is necessary to realize high precision in setting the heights of the support units 29, 31, 33, and 35 in the z-axis direction so that the size of the gap between the electronic component 12 and the circuit substrate 20 is kept constant. On the other hand, in the case in which the support units 29, 31, 33, and 35 are not in contact with the mounting surface S11, even when the heights of the support units 29, 31, 33, and 35 in the z-axis direction vary, there is no change in the size of the gap between the electronic component 12 and the circuit substrate 20. Hence, in the circuit module 10, the precision in setting the heights of the support units 29, 31, 33, and 35 in the z-axis is allowed to be relatively low.

The support units 29, 31, 33, and 35 are arranged in such a manner that both the regions A2 and A3 (A4 and A5) overlap the support units 29, 31, 33, and 35 when viewed in plan view from the z-axis direction. Hence, the circuit module 10 can prevent the electronic component 12 falling toward the region A2 (A4) side, and can also prevent the electronic component 12 falling toward the region A3 (A5) side.

In addition, the edges of the mounting surface S11 overlap the support units 29, 31, 33, and 35 when viewed in plan view from the z-axis direction. As will be described below, this allows manufacturing variations among the circuit modules 10 to be decreased. In more detail, in the circuit module 10, a change in the gap between the mounting surface S11 and the main surface S12 increases with a distance from the center (intersection of the diagonal lines) of the mounting surface S11 when the electronic component 12 is inclined at an angle θ with respect to the circuit substrate 20. Hence, in the case in which the support units 29, 31, 33, and 35 are arranged in the vicinity of the center of the mounting surface S11, only a small change in the heights of the support units 29, 31, 33, and 35 in the z-axis direction causes a large change in the angle at which the electronic component 12 is allowed to be inclined. On the other hand, in the case in which the support units 29, 31, 33, and 35 are arranged at locations spaced apart from the center of the mounting surface S11, a small change in the heights of the support units 29, 31, 33, and 35 in the z-axis direction causes almost no change in the angle at which the electronic component 12 is allowed to be inclined. Hence, it is desirable that the support units 29, 31, 33, and 35 be arranged at locations as far from the center of the mounting surface S11 as possible, to achieve an approximately constant angle at which the electronic component 12 is allowed to be inclined among a plurality of the circuit modules 10. Accordingly, in the circuit module 10, the support units 29, 31, 33, and 35 are arranged such that edges of the mounting surface S11 overlap the support units 29, 31, 33, and 35 when viewed in plan view from the z-axis direction. Note that, in the present preferred embodiment, the four corners of the mounting surface S11 preferably overlap the support units 29, 31, 33, and 35. As a result, manufacturing variations of the circuit modules 10 can be more effectively decreased.

In addition, in the circuit module 10, the magnets 13b and 13c overlap the support units 29, 31, 33, and 35 when viewed in plan view from the z-axis direction. Further, the support units 29, 31, 33, and 35 include the dummy electrodes 40, 42, 44 and 46, which are metal films. Hence, the magnet 13b attracts the dummy electrodes 40 and 44, and vice versa. Similarly, the magnet 13c attracts the dummy electrodes 42 and 46, and vice versa. The magnets 13b and 13c face one another in the y-axis direction with the external electrodes 14, 16, and 18 therebetween. Accordingly, a moment generated by a force attracting the magnet 13b in the negative direction of the z-axis is opposite to a moment generated by a force attracting the magnet 13c in the negative direction of the z-axis. Hence, when the two moments balance, the electronic component 12 is drawn to the circuit substrate 20 without being inclined. This allows the electronic component 12 to be firmly mounted on the circuit substrate 20.

The surfaces of the support units 29, 31, 33, and 35 are made of the resist films 30, 32, 34, and 36, which are insulator films. This prevents the circuit module 10 from contacting a conductor film and allows a variation in the electrical characteristics of the circuit module 10 to be suppressed.

Figure 3:
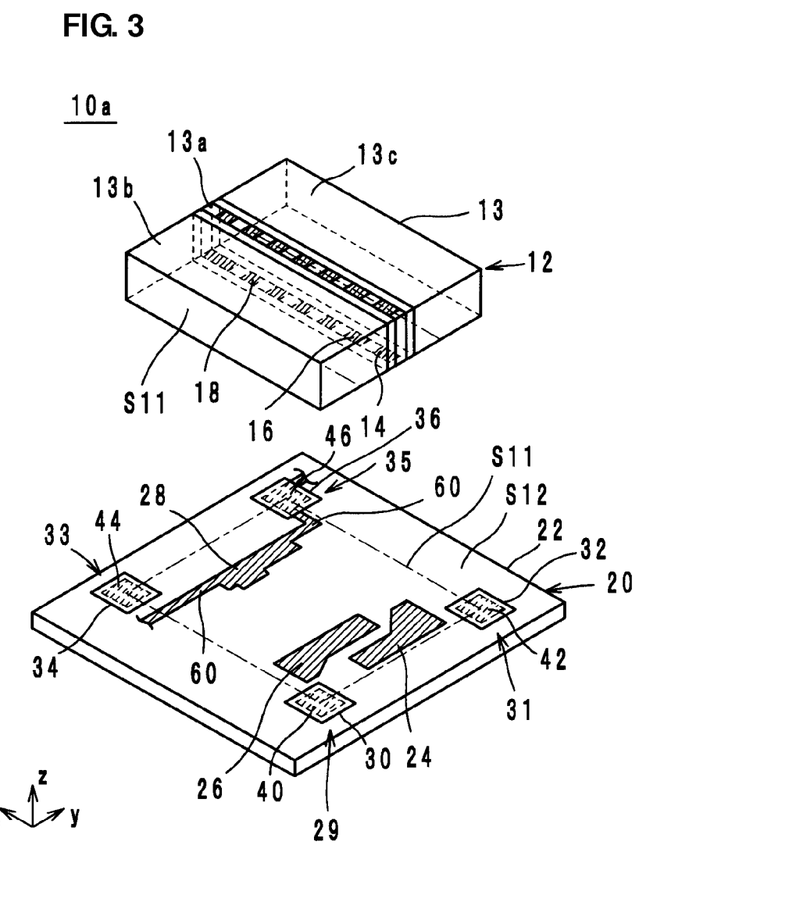
FIG. 3 is an exploded perspective view of a circuit module according to a first example modification.

Hereinafter, a circuit module according to a first example modification is described with reference to the attached drawing. FIG. 3 is an exploded perspective view of a circuit module 10a according to the first example modification.

The difference from the circuit module 10 is that the circuit module 10a has a wiring line 60. The support units 29, 31, 33, and 35 include the dummy electrodes 40, 42, 44 and 46, which are conductors. Hence, the dummy electrode 46 may be used as part of the wiring line 60, as illustrated in FIG. 3. Since the rest of the configuration of the circuit module 10a is the same as that of the circuit module 10, the description thereof is omitted.

Figure 4:
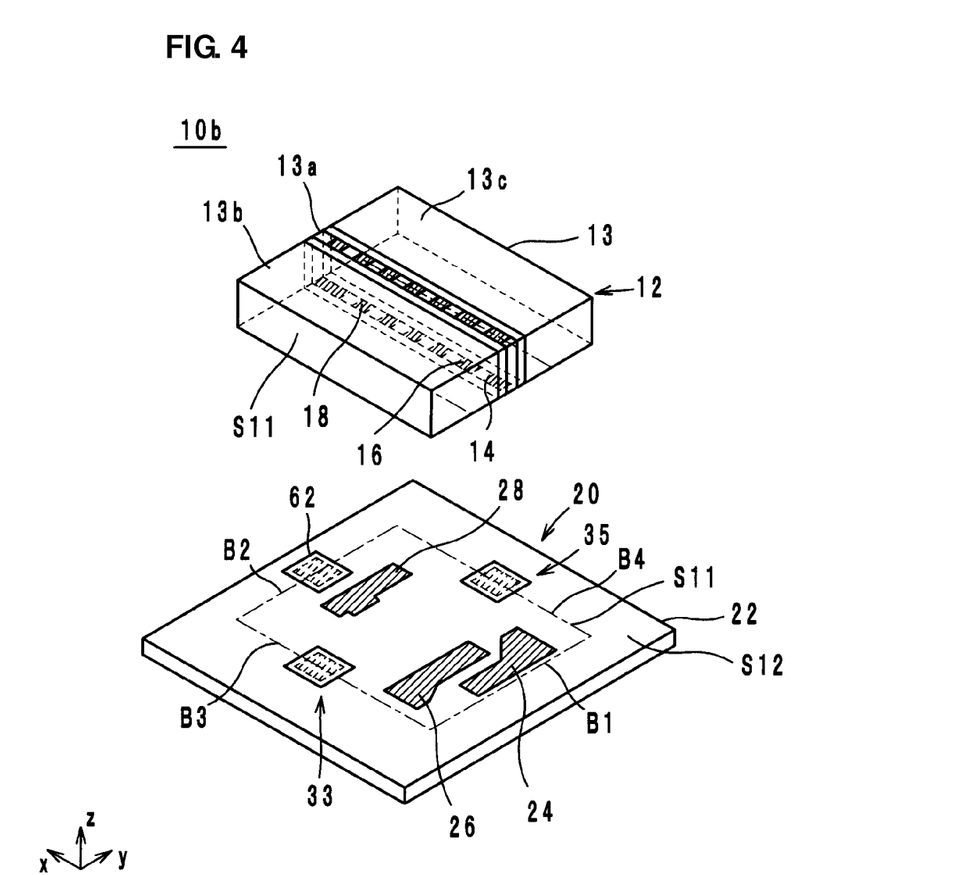
FIG. 4 is an exploded perspective view of a circuit module according to a second example modification.

Next, a circuit module according to a second example modification is described with reference to the attached drawing. FIG. 4 is an exploded perspective view of a circuit module 10b according to the second example modification.

The difference between the circuit module 10 and the circuit module 10b is the positions of the support units 29, 31, 33, and 35. In more detail, in the circuit module 10b, sides B3 and B4, rather than the corners, of the mounting surface S11 respectively overlap the support units 33 and 35 when viewed in plan view from the z-axis direction. Also by arranging the sides B3 and B4 to respectively overlap the support units 33 and 35 in this manner, manufacturing variations among the circuit modules 10b can be effectively reduced. Further, the support units 33 and 35 are arranged in such a manner that the sides B3 and B4 of the mounting surface S11 opposite each other overlap the support units 33 and 35. The sides B3 and B4 are parallel or substantially parallel with the substantially straight line L and are opposite each other with the substantially straight line L therebetween. Hence, in the circuit module 10b, the electronic component 12 is prevented from falling toward the region A2 (A4) side, and the electronic component 12 is prevented from falling toward the region A3 (A5) side.

Note that the circuit module 10b further includes a support unit 62. The support unit 62 is provided in the region A1. Hence, the support unit 62 prevents the electronic component from inclining in an xz plane rather than prevents the electronic component 12 from falling toward the region A2 or A3.

Since the rest of the configuration of the circuit module 10b is the same as that of the circuit module 10, the description thereof is omitted.

Figure 5:
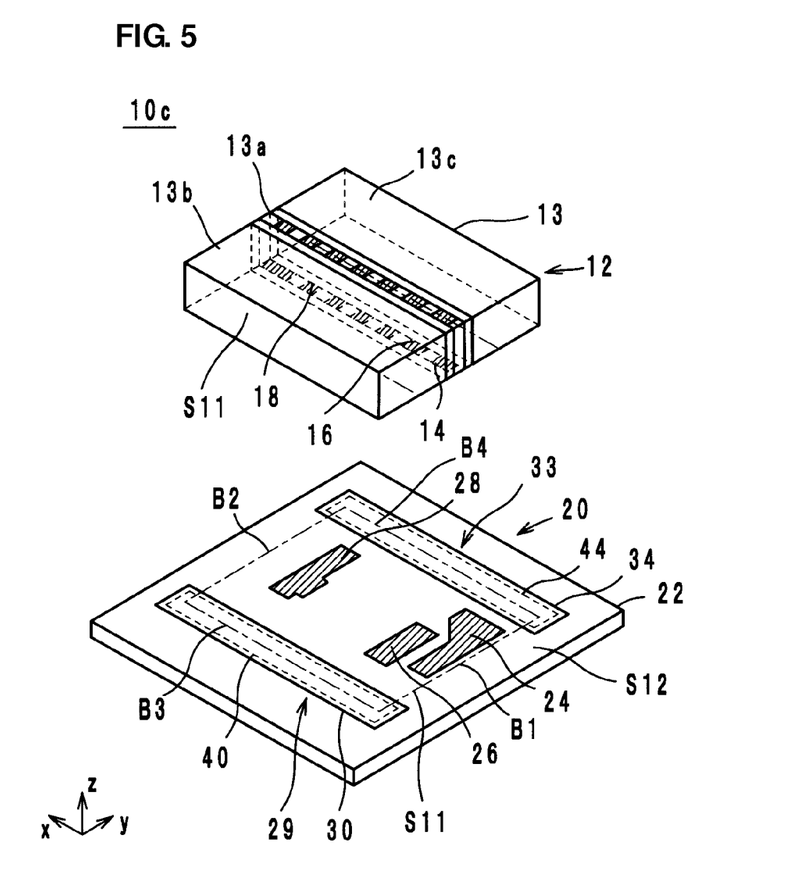
FIG. 5 is an exploded perspective view of a circuit module according to a third example modification.

Next, a circuit module according to a third example modification is described with reference to the attached drawing. FIG. 5 is an exploded perspective view of a circuit module 10c according to the third example modification.

The differences between the circuit module 10 and the circuit module 10c are the positions and the shapes of the support units 29, 31, 33, and 35. In more detail, in the circuit module 10c, the whole side B3 and the whole side B4 of the mounting surface S11 respectively overlap the support units 29 and 33 when viewed in plan view from the z-axis direction. This can reliably prevent the electronic component 12 from inclining on the circuit substrate 20.

Note that the support units 29, 31, 33, and 35 may be in contact with the mounting surface S11. In this case, the gap between the electronic component 12 and the circuit substrate 20 can be adjusted by adjusting the heights of the support units 29, 31, 33, and 35 in the z-axis direction.

The preferred embodiments of the present invention are useful for circuit modules, and specifically, provide an advantage in that an electronic component is prevented from falling over onto a circuit substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
a circuit substrate; and
an electronic component mounted on the circuit substrate, the electronic component including:
  a component body including a substantially rectangular mounting surface facing the circuit substrate; and
  a plurality of first external electrodes arranged on the mounting surface so as to extend between a first side and a second side of the mounting surface parallel or substantially parallel with each other and so as to be within a first region having a width that is substantially equal to half a length of the first side in a direction in which the first side extends; wherein
the circuit substrate includes:
  a substantially plate-shaped substrate body;
  a plurality of second external electrodes arranged on a main surface of the substrate body respectively connected to the plurality of the first external electrodes;
  a support unit disposed on and arranged to protrude from the main surface of the substrate body, the support unit being arranged such that the electronic component overlaps the support unit outside the first region when viewed in plan view from a direction of a line perpendicular to the main surface, and the support unit being disposed only outside the first region when viewed in plan view from the direction of a line perpendicular to the main surface;
the mounting surface is divided into a second region and a third region by the first region when viewed in plan view from the direction of a line perpendicular to the main surface, and the support unit is provided in a plurality such that the second and the third regions overlap the support units when viewed in plan view from the direction of the line perpendicular to the main surface; and the electronic component includes a first magnet and a second magnet respectively in the second region and the third region, and the support units include metal, and the first and the second magnets overlap the support units when viewed in plan view from the direction of a line perpendicular to the main surface.

2. The circuit module according to claim 1, wherein the plurality of the first external electrodes overlap a substantially straight line defined on the mounting surface.

3. The circuit module according to claim 1, wherein the support unit is not in contact with the mounting surface.

4. The circuit module according to claim 1, wherein the support unit is in contact with the mounting surface.

5. The circuit module according to claim 1, wherein a surface of the support unit is made of an insulator.

6. The circuit module according to claim 1, wherein the support unit includes a conductor.

7. The circuit module according to claim 1, wherein an edge of the mounting surface overlaps the support unit when viewed in plan view from the direction of a line perpendicular to the main surface.

8. The circuit module according to claim 7, wherein the mounting surface is substantially rectangular, and the support unit is provided in a plurality such that corners of the mounting surface overlap the support units when viewed in plan view from the direction of a line perpendicular to the main surface.

9. The circuit module according to claim 7, wherein the mounting surface is substantially rectangular, and the support unit is provided in a plurality such that opposing sides of the mounting surface overlap the support units when viewed in plan view from the direction of a line perpendicular to the main surface.

10. A circuit module comprising:
a circuit substrate; and
an electronic component mounted on the circuit substrate, the electronic component including:
a component body including a substantially rectangular mounting surface facing the circuit substrate; and
a plurality of first external electrodes arranged on the mounting surface and overlapping a substantially straight line defined on the mounting surface; and the circuit substrate includes:
a substantially plate-shaped substrate body;
a plurality of second external electrodes arranged on a main surface of the substrate body respectively connected to the plurality of the first external electrodes;
a support unit disposed on and arranged to protrude from the main surface of the substrate body, the support unit being arranged such that the electronic component overlaps the support unit at a location which the substantially straight line does not overlap when viewed in plan view from a direction of a line perpendicular to the main surface, and the support unit being disposed only outside the first region when viewed in plan view from the direction of a line perpendicular to the main surface;

the mounting surface is divided into a first region and a second region by the substantially straight line when viewed in plan view from the direction of the line perpendicular to the main surface, and the support unit is provided in a plurality such that the first and the second regions overlap the support units when viewed in plan view from the direction of the line perpendicular to the main surface; and the electronic component includes a third magnet and a fourth magnet respectively in the first region and the second region, and the support units include metal, and the third and fourth magnets overlap the support units when viewed in plan view from the direction of the line perpendicular to the main surface.

* * * * *